US009811007B2

(12) United States Patent
Van Boxtel et al.

(10) Patent No.: US 9,811,007 B2
(45) Date of Patent: Nov. 7, 2017

(54) LITHOGRAPHIC APPARATUS AND METHOD OF COOLING A COMPONENT IN A LITHOGRAPHIC APPARATUS

(71) Applicants: Frank Johannes Jacobus Van Boxtel, Eindhoven (NL); Antonius Johannus Van Der Net, Tilburg (NL); Leonarda Hendrika Van Den Heuvel, Aarle-Rixtel (NL)

(72) Inventors: Frank Johannes Jacobus Van Boxtel, Eindhoven (NL); Antonius Johannus Van Der Net, Tilburg (NL); Leonarda Hendrika Van Den Heuvel, Aarle-Rixtel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 875 days.

(21) Appl. No.: 13/644,653

(22) Filed: Oct. 4, 2012

(65) Prior Publication Data

US 2013/0088694 A1    Apr. 11, 2013

Related U.S. Application Data

(60) Provisional application No. 61/544,896, filed on Oct. 7, 2011.

(51) Int. Cl.
*G03B 27/52* (2006.01)
*G03F 7/20* (2006.01)

(52) U.S. Cl.
CPC ...... *G03F 7/70875* (2013.01); *G03F 7/70891* (2013.01); *G03F 7/70991* (2013.01)

(58) Field of Classification Search
CPC ............ G03F 7/70875; G03F 7/70891; G03F 7/70991; G03F 7/20
See application file for complete search history.

(56) References Cited

U.S. PATENT DOCUMENTS

| 5,937,657 A | 8/1999 | Benson et al. |
| 6,889,763 B1 | 5/2005 | Subramanian et al. |
| 2004/0105080 A1* | 6/2004 | Teunissen ........... G03F 7/70933 355/30 |
| 2004/0165161 A1 | 8/2004 | Hara |

(Continued)

FOREIGN PATENT DOCUMENTS

| JP | 2001-218424 | 8/2001 |
| JP | 2004-259778 | 9/2004 |

(Continued)

OTHER PUBLICATIONS

Korean Office Action dated Feb. 28, 2014 in corresponding Korean Patent Application No. 10-2012-0110718.

(Continued)

*Primary Examiner* — Deoram Persaud
(74) *Attorney, Agent, or Firm* — Pillsbury Winthrop Shaw Pittman, LLP (57) ABSTRACT

A lithographic apparatus includes a component and a local cooler to apply a local cooling load to the component. The local cooler has a gas passageway including a flow restriction upstream of the component and configured to direct a flow of gas exiting the flow restriction to cool a surface of the component.

16 Claims, 4 Drawing Sheets

(56) References Cited

U.S. PATENT DOCUMENTS

| | | | |
|---|---|---|---|
| 2004/0222383 A1* | 11/2004 | Kawakami | C23C 14/566 250/430 |
| 2005/0213069 A1* | 9/2005 | Murakami | B82Y 10/00 355/67 |
| 2006/0072089 A1* | 4/2006 | Eussen | G03F 7/70858 355/53 |
| 2006/0285091 A1* | 12/2006 | Parekh | G03F 7/70933 355/30 |
| 2007/0159615 A1* | 7/2007 | Horiuchi | G03F 7/7075 355/72 |
| 2008/0170210 A1* | 7/2008 | Meijer | G03F 7/70841 355/30 |
| 2009/0073395 A1* | 3/2009 | Berkvens | G03F 7/70341 355/30 |
| 2009/0213343 A1* | 8/2009 | Sewell | G01F 1/662 355/30 |
| 2009/0288427 A1* | 11/2009 | Lukens | F17C 7/00 62/51.2 |
| 2010/0183987 A1* | 7/2010 | Yonekawa | G03F 7/70925 430/325 |
| 2010/0208221 A1* | 8/2010 | Kramer | G03F 7/70341 355/30 |
| 2011/0017724 A1* | 1/2011 | Martens | G03F 7/70858 219/494 |
| 2011/0188016 A1 | 8/2011 | De Jager et al. | |
| 2011/0228239 A1 | 9/2011 | Gosen et al. | |
| 2012/0237311 A1* | 9/2012 | Dionne | B23Q 11/1061 409/135 |
| 2012/0249983 A1 | 10/2012 | Vogel et al. | |
| 2013/0155380 A1* | 6/2013 | Van Der Gaag | G03F 7/00 355/18 |
| 2015/0241796 A1* | 8/2015 | Ebert, Jr. | G03F 7/70716 355/30 |

FOREIGN PATENT DOCUMENTS

| | | |
|---|---|---|
| JP | 2005-116721 | 4/2005 |
| JP | 2005-136004 | 5/2005 |
| JP | 2009-277679 | 11/2009 |
| JP | 2010-501999 | 1/2010 |
| JP | 2010-114397 | 5/2010 |
| JP | 2010-141196 | 6/2010 |
| KR | 10-2008-0022201 | 3/2008 |
| WO | 2007-046523 | 4/2007 |
| WO | 2010/032224 | 3/2010 |

OTHER PUBLICATIONS

U.S. Appl. No. 13/564,210, filed Aug. 1, 2012, David Bessems et al.

H.J.M. ter Brake et al., "Micromachined Joule-Thomson Coolers for Cooling Low-Temperature Detectors and Electronics," University of Twente, IMPACT Research Institute, Faculty of Science and Technology, pp. 1-4 (2008).

Curtis M. Oldenburg, "Joule-Thomson Cooling Due to $CO_2$ Injection Into Natural Gas Reservoirs," Lawrence Berkeley National Laboratory Earth Sciences Division 90-1116, Berkeley, California, TOUGH Symposium, pp. 1-6 (2006).

VDI—Wärmeatlas. 8. Auflag 1997, Part Gb, Section 2.3.2.

"Joule-Thomson Effect," Physical and Chemical Data, Perry's Chemical Engineers' Handbook, pp. 3-107-3-110.

* cited by examiner

LITHOGRAPHIC APPARATUS AND METHOD OF COOLING A COMPONENT IN A LITHOGRAPHIC APPARATUS

This application claims priority and benefit under 35 U.S.C. §119(e) to U.S. Provisional Patent Application No. 61/544,896, filed on Oct. 7, 2011. The content of that application is incorporated herein in its entirety by reference.

FIELD

The present invention relates to a lithographic apparatus and a method of cooling a component in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The machine may be one in which a liquid having a relatively high refractive index, e.g. water, fills a space between the final element of the projection system and the substrate. In an embodiment, the liquid is distilled water, although another liquid can be used. Another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, and the like.

As disclosed in PCT patent application publication no. WO 2010/032224 and U.S. patent application publication no. US 2011-0188016, both hereby incorporated in their entirety by reference, instead of a conventional mask a modulator may be configured to expose an exposure area of the substrate to a plurality of beams modulated according to a desired pattern. The projection system may be configured to project the modulated beams onto the substrate and may comprise an array of lenses to receive the plurality of beams. The projection system may be configured to move the array of lenses with respect to the modulator during exposure of the exposure area.

The lithographic apparatus may be an EUV apparatus which uses extreme ultra violet light (e.g. having a wavelength of 5-20 nm).

SUMMARY

Many components in a lithographic apparatus may have an undesirable heat load applied to them. The load might be the result of impingement on the component by the projection beam, the result of electrical current flowing, etc. Such local heating is undesirable as this can lead to local deformation and thereby possible imaging errors. Additionally, if, for example, a top plate (e.g., the structure associated with the mini-environment of FIGS. 4 and 5) of the projection system through which the projection beam passes has a non-uniform temperature, this can result in a variation in refractive index or a variation from the desired shape, thus directly leading to possible imaging errors. If the temperature variation is on a substrate table, for example, this can lead to deformation of the substrate and thereby possible imaging errors.

In a lithographic apparatus, cooling liquid flowing in one or more channels in the vicinity of the applied heat load can be used. The cooling medium may be supplied at a temperature to the component lower than a set point temperature of the component. This results in fast cooling. However, a difficulty is that the low temperature of the cooling medium in a conduit to the component may have an undesirable effect on the temperature of one or more components past which the conduit passes. In a further system, the cooling medium can be provided at the set point temperature. However, in this arrangement it may be difficult for the component ever to reach the set point temperature. Additionally or alternatively, the cooling medium in a conduit exiting away from the component has a temperature above the set point temperature and this may deleteriously affect one or other components (e.g., one or more components past which the conduit passe).

It is desirable to provide a cooling system for a lithographic apparatus. In an embodiment, the cooling system addresses at least one of the above described problems associated with a cooling medium.

According to an aspect of the invention, there is provided a lithographic apparatus comprising: a component; a local cooler to apply a local cooling load to the component, the local cooler comprising: a gas passageway including a flow restriction upstream of the component and configured to direct a flow of gas exiting the flow restriction to cool a surface of the component.

According to an aspect of the invention, there is provided a method of cooling a component in a lithographic apparatus, comprising: providing a flow of gas through a gas passageway and forcing the gas through a flow restriction to expand and cool the gas; and directing the expanded and cooled gas to cool a surface of the component to be cooled.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
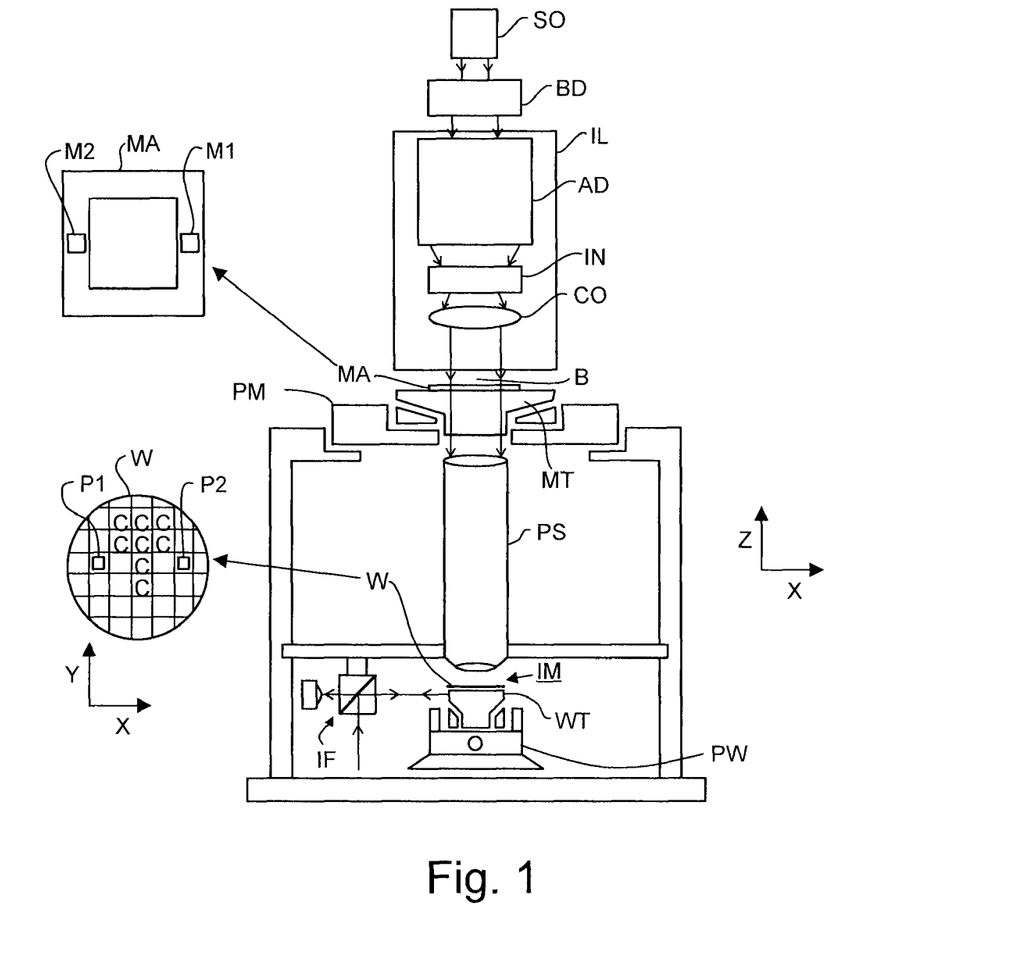
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, catadioptric, magnetic, electromagnetic, electrostatic or other types of optical components, or any combination thereof, for directing, shaping, or controlling radiation.

The support structure holds the patterning device. It holds it in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g. two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning devices (or stages or supports) which may be used in parallel in a similar manner to substrate, sensor and measurement tables.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not exclusively mean that a structure, such as a substrate, must be submerged in liquid, but rather that liquid can be located between the projection system and the substrate and/or mask during exposure. This may or may not involve a structure, such as a substrate, being submerged in liquid. Reference sign IM shows where apparatus for implementing an immersion technique may be located. Such apparatus may include a supply system for the immersion liquid and a seal member for containing the liquid in the region of interest. Such apparatus may optionally be arranged so that the substrate table is fully covered by the immersion liquid.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion partly determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, as in other modes, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
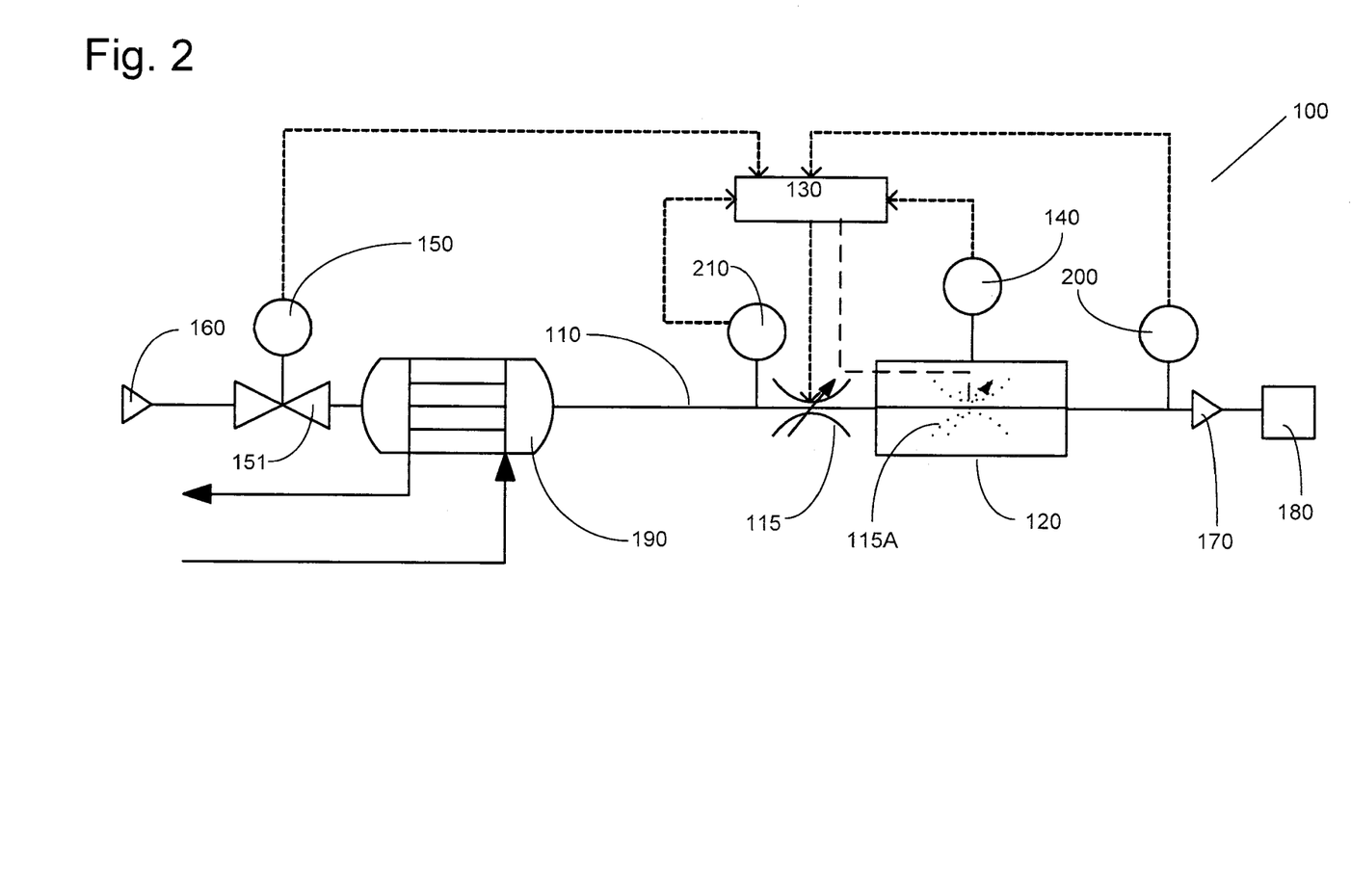
FIG. 2 illustrates schematically an embodiment of a local cooler.

FIG. 2 illustrates schematically a local cooler 100 according to an embodiment. The local cooler 100 uses the Joule-Thomson effect. The Joule-Thomson effect describes the temperature change due to sudden expansion of a real gas. Many gases cool down during expansion, such as carbon dioxide and nitrogen (and thus of course air). Other gases such as helium and hydrogen warm up. In an embodiment, carbon dioxide is used. In an embodiment, extremely clean dry air (i.e. filtered and dehumidified air sometimes referred to as XCDA and used extensively in a lithographic apparatus) is used.

The described embodiments assume the device is used as a cooler. However, an embodiment of the invention applies equally to a heater (for example to compensate for local cooling as might be experienced by a substrate in an immersion apparatus due to evaporation of immersion liquid). An example of a gas which heats up during expansion is helium.

An advantage of this cooler over a conventional liquid cooler is that the coolant gas may be supplied to the component to be cooled 120 and from the component to be cooled at a temperature close to the set point temperature of the component and/or the apparatus generally. Additionally the gas after it has been used for cooling may be re-used in the apparatus. The gas may be re-used, for example, for a purging operation to drive out unwanted gas and/or contaminants from a certain area (for example an environment surrounding a mask or the area through which a radiation beam of a position measurement system passes). The gas may be re-used as part of a gas knife, a contactless seal, or a drying station, for example. Re-use may require temperature conditioning, for example by conditioned cooling liquid used to cool the projection system, and/or filtering.

As illustrated in FIG. 2, the local cooler comprises a gas passageway 110 and a flow restriction 115. As gas flows through the gas passageway 110 and through flow restriction 115, a pressure drop is created. This results in a sudden expansion of the gas and cooling of the gas according to the Joule-Thomson effect. The cooled gas is then directed to cool the surface of the component 120 to be cooled. In an embodiment this is accomplished by directing the cooled gas to flow over a surface of the component 120 to be cooled. In an embodiment the cooled gas is used to cool a conduit which extracts heat from the surface of the component 120 to be cooled. The cooling may be by direct or indirect contact of the cooled gas with the surface of the component 120 to be cooled.

In an embodiment the local cooler comprises more than one passageway 110 with corresponding flow restriction 115. The expanded gas of each passageway 110 may be directed to different areas of the surface of the component 120 to be cooled. In this way a local cooling load can be applied at different locations and the whole surface of the component 120 can be maintained isothermal with appropriate control.

In an embodiment more than one flow restriction 115 is provided in the passageway 110. The gas in contact with the surface of the component 120 will be raised in temperature by the surface so that the cooling load closest to the flow restriction 115 is greater than further away from the flow restriction 115. To compensate for this and allow a more uniform cooling load to be applied to a large surface, more than one flow restriction 115 may be provided in series such that the gas expands at least two times thereby being cooled twice. This is illustrated in dotted lines by second flow restriction 115A in FIG. 2. Any number of flow restrictions 115, 115A may be provided in series in the gas passageway 110.

A cooling controller 130 is provided to control the pressure drop of gas over the flow restriction 115, 115A and thereby the magnitude of the local cooling load. In the embodiment of FIG. 2 the flow restriction 115, 115A is a variable flow restriction. The cooling controller 130 is adapted to control the magnitude of the flow restriction (e.g. the size of a slit or hole through which the gas passes) and thereby the magnitude of the pressure drop.

The cooling controller 130 can control the magnitude of the pressure drop (e.g. size of the flow restriction 115, 115A) in any manner. In an embodiment, the cooling controller 130 works on a feedforward basis (where the controller knows to expect a heat load to be applied to the surface of the component to be cooled 120 and can anticipate a subsequent rise in temperature).

In an embodiment, as illustrated in FIG. 2, the cooling controller 130 controls the pressure drop in a feedback manner. In an embodiment, the control is based upon a temperature (e.g. of the surface) of the component 120 sensed by a (surface) temperature sensor 140. Thus, if the temperature of the surface of the component 120 rises above a certain (e.g., predetermined) value, the controller 130 can increase the pressure drop (e.g. by a decrease in the size of the flow restriction) thereby to increase the magnitude of the local cooling load. Conversely, if the surface temperature of the component 120 rises such that a lower cooling load is desired the controller 130 can decrease the pressure drop by increasing the size of the flow restriction 115, 115A and thereby decreasing the magnitude of the local cooling load.

In the embodiment of FIG. 2 a mass flow controller 150 is provided which provides a substantially constant flow of gas along the passageway 110. The mass flow controller 150 (which may incorporate a pump 151) is configured to provide a certain, e.g. predetermined, flow of gas through the passageway 110. The controller 130 controls the magnitude of the cooling load solely by adjusting the variable flow restriction 115. As will be described with reference to FIG. 3, in an embodiment the mass flow controller 150 may be instructed by the controller 130 to adjust the magnitude of the flow of gas. By changing the pressure on the upstream side of the flow restriction 115, 115A the magnitude of the pressure drop over the flow restriction 115, 115A can be changed. Additionally, a higher mass flow rate results in a higher heat transfer coefficient and an increase in the thermal capacity of the flow of gas.

As described above, the gas may be carbon dioxide or XCDA or nitrogen and is supplied from a source 160. The gas at the end of the passageway arrives at an outlet 170 which is downstream of the surface of the component 120 to be cooled. In an embodiment a gas handling system 180 is connected to the outlet 170. The gas handling system 180 may use the gas from the passageway 110. The use may be for a purpose other than as a coolant. Examples of use of the gas include: to purge a space of unwanted gas and/or particles (for example, from a microenvironment or from a space through which a measurement beam of a measurement system passes), to form a contactless seal between two surfaces, and/or to dry a wet surface.

In an embodiment the gas exiting outlet 170 is recycled to gas source 160. In an embodiment the gas exiting outlet 170 is allowed into the environment in which the lithographic apparatus is situated. The outlet 170 may be connected to an exhaust system outside of the lithographic apparatus.

A heat exchanger 190 may be provided upstream of the flow restriction 115, 115A. The heat exchanger 190 may use liquid as a heat transfer medium, for example. The heat exchanger 190 makes the temperature of the gas sufficiently close to the reference temperature of the apparatus so that one or more conduits forming the passageway 110 will be at a temperature close to the reference temperature of the components and/or apparatus generally.

A downstream temperature sensor 200 may be provided to measure the temperature of gas in the gas passageway 110 downstream of the component 120 (e.g., the surface of the component 120). The cooling controller 130 can monitor the temperature measured by the downstream temperature sensor 200. This temperature can be used in the control loop. For example, the cooling controller 130 may be adapted to adjust the pressure drop based on the temperature measured by the downstream temperature sensor 200 (e.g. in a feedback manner). Alternatively or additionally, the temperature measured by the downstream temperature sensor 200 may be used to help ensure that the gas downstream of the component 120 is close to the set point temperature of the component and/or apparatus generally.

In an embodiment, a pressure sensor 210 is provided to measure the pressure of gas in the passageway 110 upstream of the flow restriction 115, 115A. The output of the pressure sensor 210 may be provided to a limit controller (which may be part of the cooling controller 130). The limit controller may limit the pressure of gas in the passageway 110 upstream of the flow restriction 115, 115A when the pressure measured by the pressure sensor 210 exceeds a certain value. For example, the limit controller may control the size of the flow restriction 115, 115A and/or instruct the mass flow controller 150 to reduce the mass flow rate of gas in the passageway 110 and/or activate (or be) a pressure regulator to regulate gas pressure in the passageway 110 upstream of the flow restriction. In an embodiment the cooling controller 130 may adjust the pressure of the pressure regulator thereby to control the pressure drop over the flow restriction 115, 115A.

In an embodiment the cooling controller 130 may control the mass flow controller 150 and/or flow restriction 115, 115A at least partly on the basis of the pressure measured by the pressure sensor 210.

As illustrated in FIG. 2, the mass flow controller 150 may send a signal to the cooling controller 130. The signal may, for example, relate to the system's limitations such as information about the maximum mass flow reached, or information that the mass flow controller 150 cannot increase the mass flow beyond a certain point (e.g. beyond the current rate). Alternatively or additionally, the mass flow could be increased when the maximum pressure drop is achieved to further increase the cooling power. The cooling controller 130 can use feedback from one or more of the sensors 140, 200, 210 to change the strategy or to provide feedback to the user that a system limitation has been reached.

Figure 3:
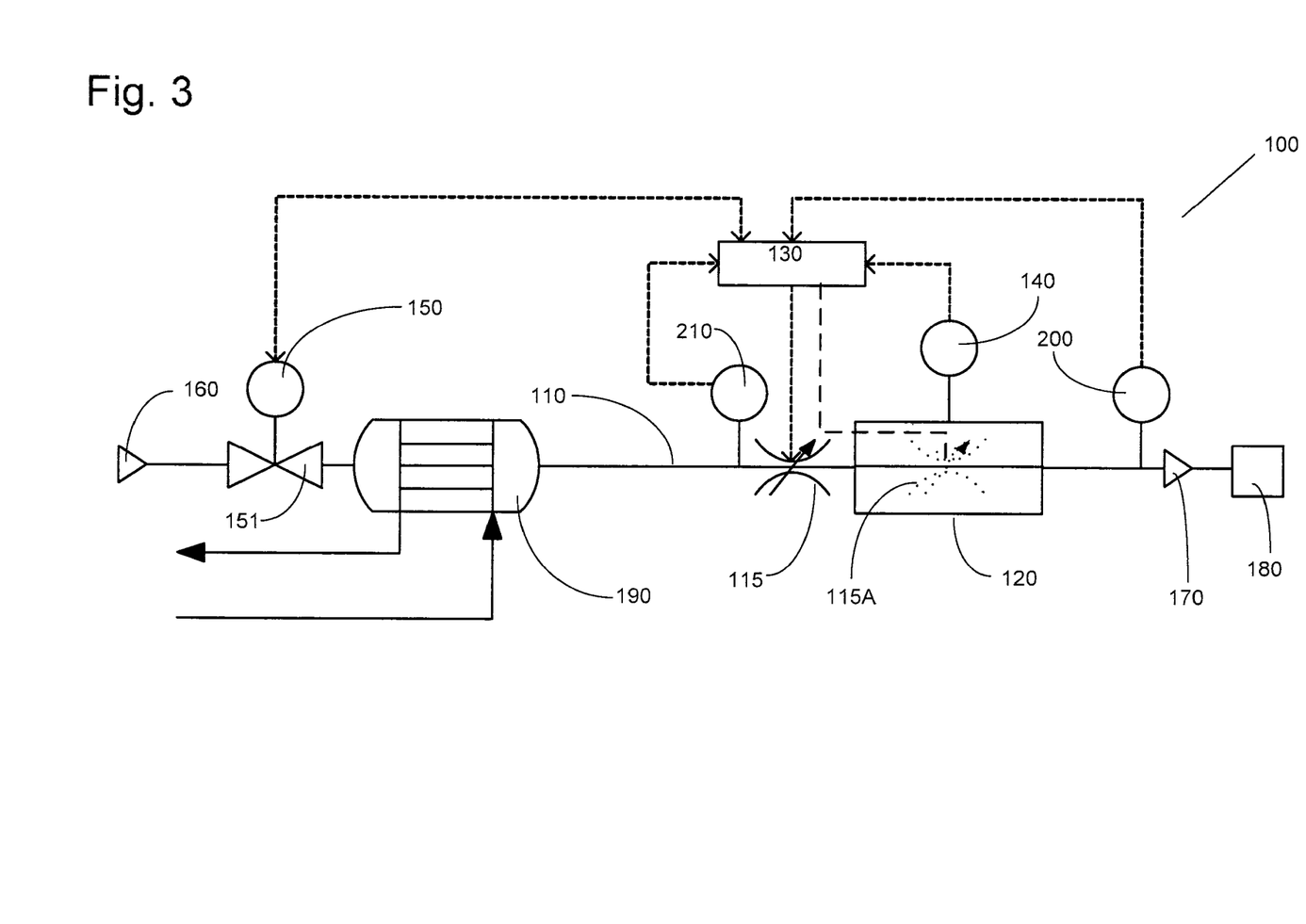
FIG. 3 illustrates schematically an embodiment of a local cooler.

FIG. 3 illustrates a further embodiment. The embodiment of FIG. 3 is the same as that of FIG. 2 except as described below.

In the embodiment of FIG. 3 the cooling controller 130 controls the mass flow controller 150. The pressure drop over the flow restriction 115, 115A is changed at least partly by varying the flow of gas through the passageway 110 by adjusting the mass flow controller 150. In such an embodiment the flow restriction 115, 115A may be a variable flow restriction (in which case the cooling controller 130 can vary the pressure drop by varying both the mass flow rate and flow restriction size). In an embodiment the flow restriction 115, 115A may be a fixed restriction so that the pressure drop is only controlled by varying the mass flow rate through the flow passageway 110.

A pressure regulator upstream of the flow restriction 115, 115A may be used to vary the pressure in the gas passageway 110 upstream of the flow restriction 115, 115A. By varying the setting of the pressure regulator the pressure drop over the flow restriction 115, 115A can be varied.

The cooling system is very flexible and has a relatively simple control that does not involve cooling media flow at a temperature deviating from the set-point temperature. The response time of the system may be superior to a liquid based closed-loop cooling system which suffers from thermal inertia. That is, the time lag between heating up a liquid (to extract energy) is greater than for a gas because of the higher heat capacity of the liquid.

The cooling system may not require a temperature conditioning setup like a liquid based cooling system does. However, a liquid based cooling system may extract more heat energy than the cooling system described herein. In an embodiment no return passageway for gas to be recycled is required. That may reduce the number of hoses in hose bundles. This is beneficial in terms of used volume and stiffness and dynamic performance issues.

As mentioned above, after the gas has been used to cool the surface of the component 120, the gas can be used to address other issues in an efficient way.

Additionally, liquid in a lithographic apparatus is generally undesirable. In certain areas the presence of liquid must be avoided. In other areas leaking of liquid could cause a problem whereas leaking of gas is less of an issue.

The following shows that a cooling system with a passageway 110 of dimension of 1×200×300 mm with a gas flow velocity less than 10 m/s and a Reynolds number below 2200 for a flow rate of 100 normal liters per minute (ambient pressure and 0° C.), a heat transfer coefficient of about 100 $W/m^2K$ is achieved for XCDA whereas for $CO_2$ a heat transfer coefficient of about 65 $W/m^2K$ is achieved. Data for carbon dioxide and air shows that at 22° C. the Joule-Thomson coefficient for $CO_2$ is about 1.080 K/bar whereas for XCDA the Joule-Thomson coefficient is about 0.237 K/bar. This shows that heat transfer in the above area (1×0.2 m×0.3 m) with a pressure drop of about 4 bar could result in an average heat transfer in the heat transfer area of about 50 $W/m^2$ for XCDA and about 130 $W/m^2$ for $CO_2$. The limiting factor is the heat capacity of the gas flow so that the cooling power of the XCDA gas flow is about 2.2 W and for $CO_2$ about 11 W.

Although the above shows that the amount of heat extracted by the cooling system may not be that large, this is a useful amount of cooling for certain components, particularly those described above, in a lithographic apparatus.

The cooling system 100 may be used to cool any component of the lithographic apparatus. Examples include a part of a substrate table WT, for example an actuator of the substrate table WT, particularly for a substrate table WT adapted for use with substrate W with a diameter (or equivalent dimension) of 450 mm or 300 mm. The invention is not limited to the size/shape of a substrate. A substrate table WT for a large substrate W may include one or more manipulators to flatten the surface of the substrate W and such a manipulator may be of a size such that the heat load applied thereto by electric current flowing therein is low enough to be extracted by the cooling system described above. The cooling system could be used to locally cool a substrate, for example from the underside of a substrate support for a substrate W. The cooling system may be used to cool a component of the projection system PS, including a top plate.

The cooling system 100 could be used to cool a component such as a sensor or a table (position) encoder of a lithographic apparatus. The cooling system 100 could be used to cool a component of a lithographic using a patterning array or a modulator to pattern the projection beam (e.g., an array of lenses to receive a plurality of beams from the modulator) or of an EUV lithographic apparatus. One or more conduits used to provide gas to (and from) the component may be flexible with a flow restriction 115 provided upstream of the component.

The cooling system 100 could be used to cool a top plate described below with reference to FIGS. 4 and 5. The top plate may be locally heated by a support structure MT motor and/or the projection beam PB and/or a reticle fiducial (which may be heated by a laser during measurement and then radiate heat to the top plate).

In a lithographic projection apparatus, it is desirable to maintain a controlled internal gaseous environment in the region of the patterning device MA. The internal gaseous environment in the region of the patterning device may be controlled to prevent contaminants and/or air with a variable property interfering with the radiation beam and/or a sensitive element of the patterning device. The internal gaseous environment will typically be substantially isolated from the region outside, but not perfectly sealed off. A gas supply system having an outlet into the internal gaseous environment may be provided and configured to maintain an overpressure in the internal gaseous environment. The overpressure drives a flow (e.g., a substantially constant flow) of gas out of the internal gaseous environment i.e. serves to purge the environment. The outward flow of gas helps to prevent inflow of contaminants. The outward flow of gas may be channeled through a leaky seal, for example through opposed flow-restricting surfaces. Additionally, it is desirable that the path through which one or more encoder and/or interferometer beams of a measurement system pass be free of contaminants and have one or more substantially constant properties.

Figure 4:
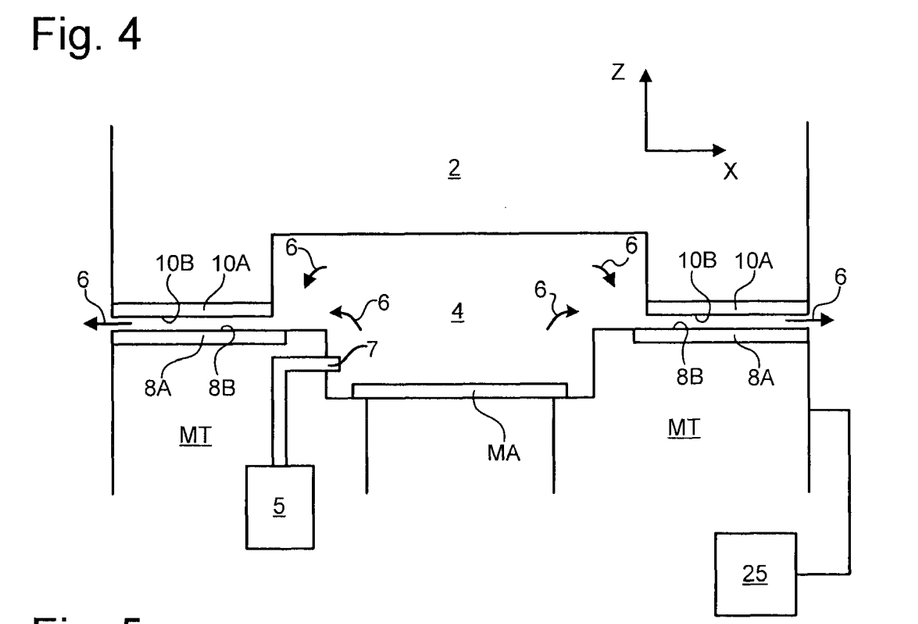
FIG. 4 depicts an internal gaseous environment and first and second planar elements on an upper side (in the z direction) of the support for the patterning device.

FIG. 4 depicts an embodiment showing how control of an internal gaseous environment 4 can be achieved in a region above the support MT. The internal gaseous environment 4 in this example is located between the patterning device MA and support MT on one side, and a final element (and surrounding hardware) 2 of the illumination system IL on the other side. The internal gaseous environment 4 depicted is thus a volume through which the radiation beam will pass before it encounters the patterning device MA.

Figure 5:
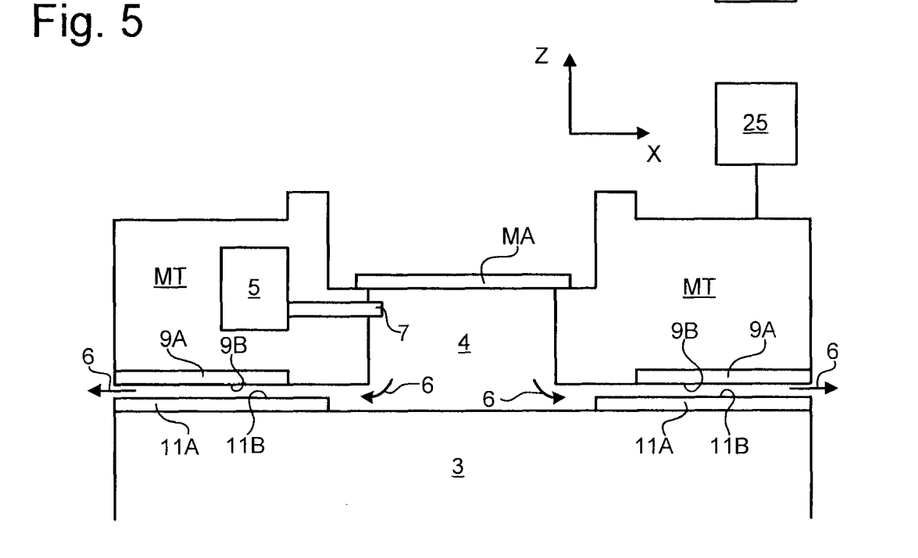
FIG. 5 depicts an internal gaseous environment and first and second planar elements on a lower side (in the z direction) of the support.

In the example of FIGS. 4 and 5, a gas supply system 5 is provided to supply gas via an outlet 7 to the internal gaseous environment 4. The gas may be supplied with a controlled composition and/or at a controlled flow rate. The gas may come from the outlet 170 of the cooling system. Optionally, an overpressure is maintained within the internal gaseous environment 4. The overpressure results in an outward flow of gas, as shown schematically by arrows 6. The gas supply system 5 and/or outlet 7 may be mounted on or within the patterning device support MT (as shown) and/or on or within an element above and/or below the patterning device support MT. For example, the gas supply system 5 and/or outlet 7 may be mounted on or within a final element 2 of the illumination system IL. Alternatively or additionally, the gas supply system 5 and/or outlet 7 may be mounted on or within a first element 3 of the projection system PS.

The spatial distribution of flows/velocities can be controlled by first and second planar elements 8A, 10A, as shown in FIG. 4. The first planar element 8A is such as to present a first flow-restricting surface 8B. The second planar element 10A is such as to present a second flow-restricting surface 10B.

The flow-restricting surfaces 8B, 10B of FIG. 4 face each other and are configured to resist inward and outward gas flow through the gap between them. Resisting inward gas flow helps to reduce contamination of the internal gaseous environment 4. Resisting outward gas flow helps the gas supply system 5 maintain a stable overpressure in the internal gaseous environment 4. The flow-restricting surfaces 8B, 10B also present a relatively small gap through which the outflow of gas passes. This results in an increase in velocity of the outflow of gas. The increase in velocity counters diffusion of contaminants inwards. Also a higher outflow velocity may be beneficial for the following reason. For example, when the patterning device support MT is moved along Y in a first direction, it creates a lower pressure region in its wake, which tends to be filled by environmental gas (e.g. air), which it is desirable to keep out of the internal gaseous environment. When the patterning device support MT then scans back in the opposite direction, it is desirable that the output velocity should be higher at least than the scan speed of the patterning device support MT (and desirably higher than the scan speed plus the maximum velocity of inflow of environmental gas into the lower pressure region) in order to reduce or completely avoid significant inflow of the environment gas into the internal gaseous environment.

FIG. 5 depicts an arrangement corresponding to the arrangement of FIG. 4 except that the internal gaseous environment 4 is located below the patterning device MA. The internal gaseous environment 4 depicted is thus a volume through which the radiation beam will pass after it has encountered the patterning device MA. The internal gaseous environment 4 is contained by the support MT and patterning device MA on one side and by a first element (and surrounding hardware) 3 (e.g. a (at least partially transparent) top plate which may be cooled by the above described cooling system) of the projection system PS on the other side. The support MT in this example comprises a first planar element 9A formed in a lower portion thereof. The first planar element 9A has a first flow-restricting surface 9B. The first element of the projection system PS has a second planar element 11A attached to an upper surface thereof. The second planar element 11A has a second flow-restricting surface 11B. The second flow-restricting surface 11B is configured to face the first flow-restricting surface 9B.

In both the arrangement of FIG. 4 and the arrangement of FIG. 5, arrows 6 show schematically the flow of gas from the outlet 7 of the gas supply system 5 through a central region of the internal gaseous environment 4 and out through the gap between the flow-restricting surfaces 8B, 9B, 10B, 11B to the region outside the internal gaseous environment 4.

In an embodiment, there is disclosed a lithographic apparatus comprising: a component; a local cooler to apply a local cooling load to the component, the local cooler comprising: a gas passageway including a flow restriction upstream of the component and configured to direct a flow of gas exiting the flow restriction to cool a surface of the component.

In an embodiment, the gas passageway further comprises an outlet downstream of the component. In an embodiment, a gas handling system is connected to the outlet and configured to use gas from the passageway for a purpose primarily other than as a coolant. In an embodiment, the gas handling system is configured to use the gas from the passageway to purge a space of unwanted gas or contaminants or to form a contactless seal between two surfaces or to dry a wet surface. In an embodiment, the local cooler further comprises a cooling controller adapted to control a pressure drop of gas over the flow restriction and thereby the magnitude of the local cooling load on the component. In an embodiment, the flow restriction is a variable flow restriction and the cooling controller is configured to control the size of the flow restriction and thereby the magnitude of the pressure drop. In an embodiment, the lithographic apparatus further comprises a mass flow controller configured to provide a certain flow of gas through the passageway. In an embodiment, the mass flow controller is configured to maintain the flow of gas at a substantially constant magnitude. In an embodiment, the cooling controller is configured to control the mass flow controller to adjust the magnitude of the flow of gas and thereby the magnitude of the pressure drop. In an embodiment, the lithographic apparatus further comprises a pressure regulator configured to regulate gas pressure in the passageway upstream of the flow restriction. In an embodiment, the cooling controller is configured to vary a pressure setting of the pressure regulator and thereby the pressure drop over the flow restriction. In an embodiment, the lithographic apparatus further comprises a temperature sensor to sense a temperature of the component. In an embodiment, the cooling controller is configured to adjust the pressure drop in a feedback manner based on the temperature sensed by the temperature sensor. In an embodiment, the lithographic apparatus further comprises a downstream temperature sensor to measure a temperature of gas in the passageway downstream of the component. In an embodiment, the cooling controller is configured to adjust the pressure drop based on the temperature measured by the downstream temperature sensor. In an embodiment, the lithographic apparatus further comprises a pressure sensor configured to measuring a pressure of gas in the passageway upstream of the flow restriction. In an embodiment, the lithographic apparatus further comprises a limit controller configured to limit the pressure of gas in the passageway upstream of the flow restriction when the pressure measured by the pressure sensor exceeds a certain value. In an embodiment, the lithographic apparatus further comprises a heat exchanger configured to maintain gas in the passageway upstream of the flow restriction at a certain temperature. In an embodiment, the component is part of a substrate table configured to support a substrate. In an embodiment, the component is part of a projection system. In an embodiment, the component is a projection system top plate. In an embodiment, the lithographic apparatus is configured to release gas from downstream of the flow restriction into the apparatus.

In an embodiment, there is provided a method of cooling a component in a lithographic apparatus, comprising: providing a flow of gas through a gas passageway and forcing the gas through a flow restriction to expand and cool the gas and directing the expanded and cooled gas to cool a surface of the component to be cooled.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The invention may be applied to substrates with a diameter of 300 mm or 450 mm or any other size.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include a data storage medium or data storage media for storing such computer programs, and/or hardware to receive such a medium/media. So the controller(s) may operate according the machine readable instructions of one or more computer programs.

One or more embodiments of the invention may be applied to any immersion lithography apparatus, whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or readheads that cooperate with the scale(s) or grid(s) to determine the position, velocity, etc. of the component.

The term "lens", where the context allows, may refer to any one or combination of various types of optical components, including refractive, reflective, catadioptric, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a component;
   a local cooler to apply a local cooling load to the component, the local cooler comprising:
      a gas passageway including a flow restriction upstream of the component and configured to direct a flow of gas exiting the flow restriction to cool a surface of the component, wherein the gas passageway further comprises an outlet downstream of the component; and
      a gas handling system connected to the outlet and configured to use gas from the passageway for a purpose primarily other than as a coolant, wherein the gas handling system is configured to use the gas from the passageway to purge a space of unwanted gas or contaminants or to form a contactless seal between two surfaces or to dry a wet surface.

2. The lithographic apparatus of claim 1, wherein the local cooler further comprises a cooling controller adapted to control a pressure drop of gas over the flow restriction and thereby the magnitude of the local cooling load on the component.

3. The lithographic apparatus of claim 2, wherein the flow restriction is a variable flow restriction and the cooling controller is configured to control the size of the flow restriction and thereby the magnitude of the pressure drop.

4. The lithographic apparatus of claim 2, further comprising a pressure regulator configured to regulate gas pressure in the passageway upstream of the flow restriction.

5. The lithographic apparatus of claim 4, wherein the cooling controller is configured to vary a pressure setting of the pressure regulator and thereby the pressure drop over the flow restriction.

6. The lithographic apparatus of claim 2, further comprising a temperature sensor to sense a temperature of the component and wherein the cooling controller is configured to adjust the pressure drop in a feedback manner based on the temperature sensed by the temperature sensor.

7. The lithographic apparatus of claim 2, further comprising a downstream temperature sensor to measure a temperature of gas in the passageway downstream of the component.

8. The lithographic apparatus of claim 7, wherein the cooling controller is configured to adjust the pressure drop based on the temperature measured by the downstream temperature sensor.

9. The lithographic apparatus of claim 1, further comprising a heat exchanger configured to maintain gas in the passageway upstream of the flow restriction at a certain temperature.

10. The lithographic apparatus of claim 1, wherein the component is part of a substrate table configured to support a substrate, or a projection system, or a projection system top plate.

11. A lithographic apparatus comprising:
    a component;
    a local cooler to apply a local cooling load to the component, the local cooler comprising:
       a gas passageway including a flow restriction upstream of the component and configured to direct a flow of gas exiting the flow restriction to cool a surface of the component;
       a pressure regulator configured to regulate gas pressure of the flow of gas in the passageway upstream of the flow restriction;
       a mass flow controller, separate from the pressure regulator, configured to control the flow rate of the flow of gas in the passageway upstream of the flow restriction; and
       a cooling controller adapted to control a pressure drop of gas over the flow restriction and thereby the magnitude of the local cooling load on the component.

12. The lithographic apparatus of claim 11, wherein the mass flow controller is configured to maintain the flow of gas at a substantially constant magnitude.

13. The lithographic apparatus of claim 11, wherein the cooling controller is configured to control the mass flow controller to adjust the magnitude of the flow of gas and thereby the magnitude of the pressure drop.

14. The lithographic apparatus of claim 11, comprising a pressure sensor configured to measure a pressure of gas in the passageway upstream of the flow restriction.

15. The lithographic apparatus of claim 14, further comprising a limit controller configured to limit the pressure of gas in the passageway upstream of the flow restriction when the pressure measured by the pressure sensor exceeds a certain value.

16. A lithographic apparatus comprising:
    a component;
    a local cooler to apply a local cooling load to the component, the local cooler comprising:
       a gas passageway including first and second flow restrictions each configured to cause sudden expansion of gas and configured to direct a flow of gas exiting the first and second flow restrictions to cool a surface of the component, wherein the first flow restriction is fluidly connected to, and upstream of, the second flow restriction such that a same flow of gas passing through the first flow restriction passes through the second flow restriction.

* * * * *